(12) United States Patent
Richter et al.

(10) Patent No.: US 11,131,299 B2
(45) Date of Patent: Sep. 28, 2021

(54) PUMP COMPRISING A POLYGON-SHAPED PIEZO DIAPHRAGM TRANSDUCER

(71) Applicant: Fraunhofer-Gesellschaft zur Foerderung der angewandten Forschung e.V., Munich (DE)

(72) Inventors: Martin Richter, Munich (DE); Yuecel Congar, Buchloe (DE); Klaus Heinrich, Munich (DE); Waltraud Hell, Munich (DE); Martin Wackerle, Assling (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 352 days.

(21) Appl. No.: 15/419,015

(22) Filed: Jan. 30, 2017

(65) Prior Publication Data
US 2017/0226994 A1   Aug. 10, 2017

(30) Foreign Application Priority Data

Feb. 4, 2016   (DE) .................. 10 2016 201 718.7

(51) Int. Cl.
| | |
|---|---|
| *F04B 43/04* | (2006.01) |
| *H01L 41/09* | (2006.01) |
| *H01L 41/311* | (2013.01) |
| *H01L 41/338* | (2013.01) |
| *F04B 45/047* | (2006.01) |
| *F04B 53/16* | (2006.01) |

(52) U.S. Cl.
CPC .......... *F04B 43/046* (2013.01); *F04B 45/047* (2013.01); *F04B 53/16* (2013.01); *H01L 41/098* (2013.01); *H01L 41/0973* (2013.01); *H01L 41/311* (2013.01); *H01L 41/338* (2013.01)

(58) Field of Classification Search
CPC .................................................. F04B 43/046
See application file for complete search history.

(56) References Cited

U.S. PATENT DOCUMENTS

| | | | | |
|---|---|---|---|---|
| 4,820,897 | A | * 4/1989 | Lefevre .................... | H03H 3/02 219/121.61 |
| 5,853,514 | A | 12/1998 | Takeuchi et al. | |

(Continued)

FOREIGN PATENT DOCUMENTS

| | | |
|---|---|---|
| DE | 19834461 C2 | 9/2000 |
| DE | 69607551 T2 | 11/2000 |

(Continued)

*Primary Examiner* — Moshe Wilensky
*Assistant Examiner* — Kyle A Cook
(74) *Attorney, Agent, or Firm* — Michael A. Glenn; Perkins Coie LLP

(57) ABSTRACT

The invention relates to a pump having a piezo diaphragm transducer arranged at a pump body of the pump, and to a method for producing a pump, wherein a piezo diaphragm transducer is mounted to a pump body, wherein the method, among other things, has providing a piezoceramic layer. In accordance with the invention, at least one piezo element is diced from the piezoceramic layer so that the at least one piezo element has a regular polygon shape having at least six corners. In addition, the method has forming the piezo diaphragm transducer by mounting the piezo element to a pump diaphragm.

11 Claims, 11 Drawing Sheets

(56) References Cited

U.S. PATENT DOCUMENTS

| | | | |
|---|---|---|---|
| 6,334,761 B1* | 1/2002 | Tai | F04B 43/043 |
| | | | 137/852 |
| 2001/0017502 A1* | 8/2001 | Kappel | H01L 41/0833 |
| | | | 310/328 |
| 2002/0009374 A1* | 1/2002 | Higashino | F04B 43/046 |
| | | | 417/322 |
| 2003/0088969 A1 | 5/2003 | Karlinski | |
| 2005/0123420 A1 | 6/2005 | Richter et al. | |
| 2009/0148318 A1* | 6/2009 | Kamitani | F04B 43/04 |
| | | | 417/413.2 |
| 2010/0310397 A1* | 12/2010 | Janse Van Rensburg | |
| | | | F04B 43/04 |
| | | | 417/488 |
| 2013/0055889 A1 | 3/2013 | Herz et al. | |
| 2013/0068325 A1* | 3/2013 | Herz | F04B 43/043 |
| | | | 137/565.01 |

FOREIGN PATENT DOCUMENTS

| | | |
|---|---|---|
| DE | 10238600 A1 | 3/2004 |
| JP | H07148925 A | 6/1995 |
| JP | 2000082852 A | 3/2000 |
| JP | 2013522512 A | 6/2013 |
| WO | 2011107162 A1 | 9/2011 |

\* cited by examiner

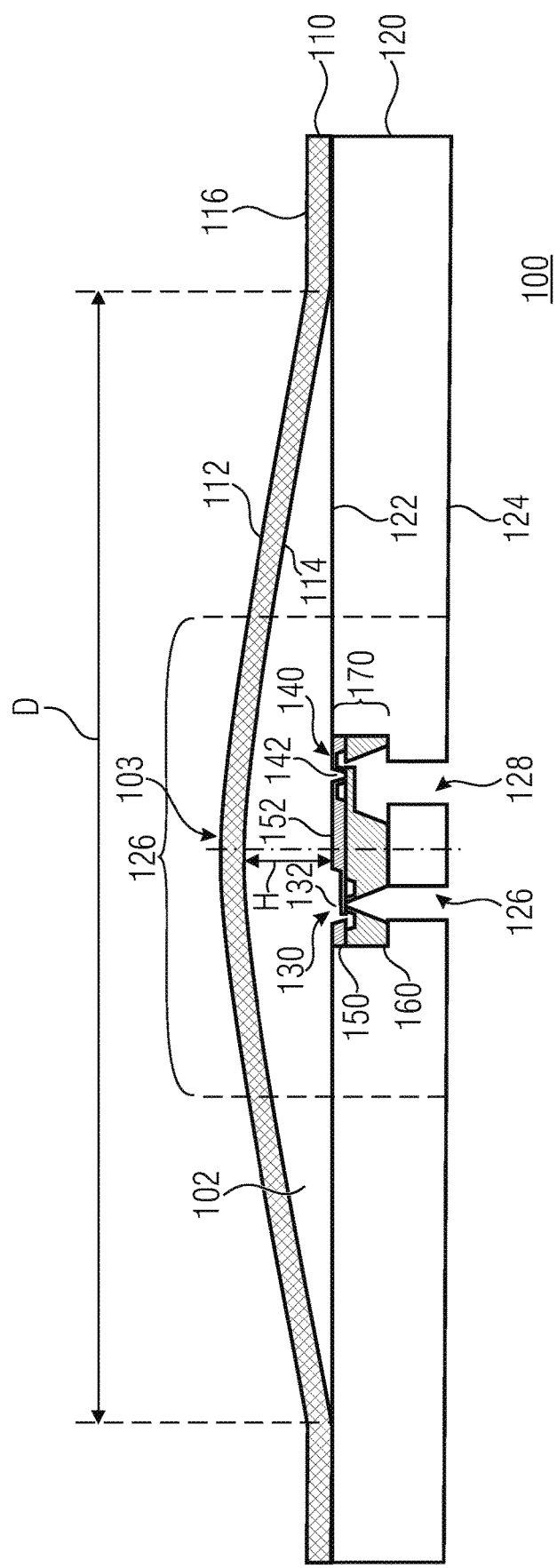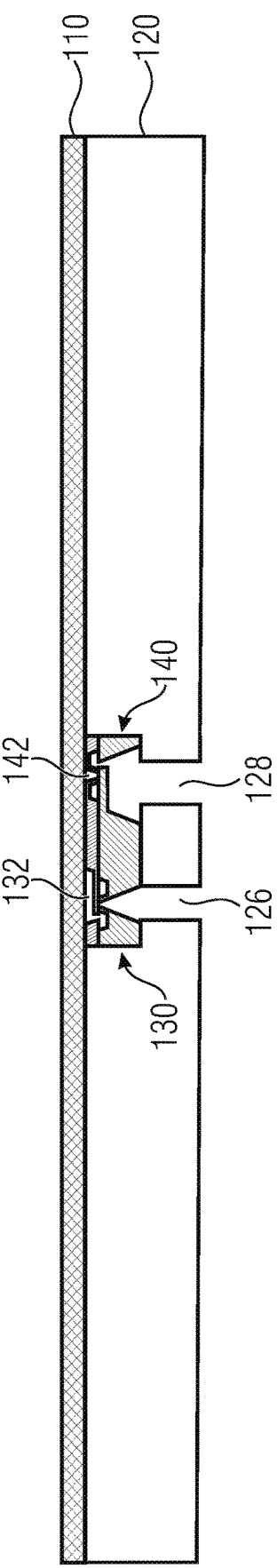
Figure 1E
Figure 1F

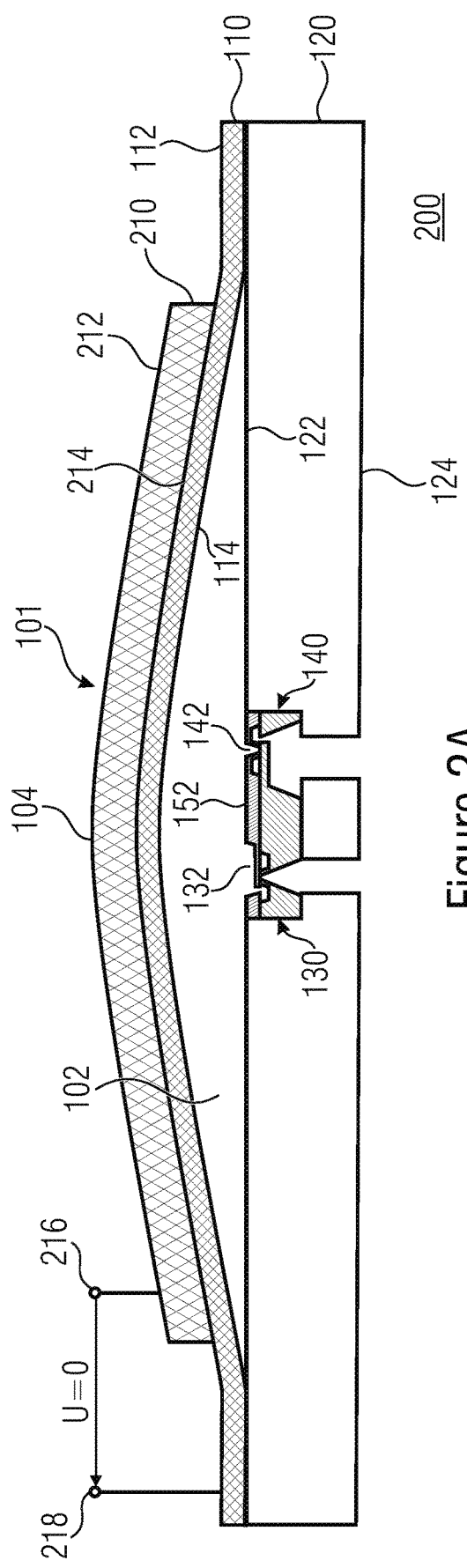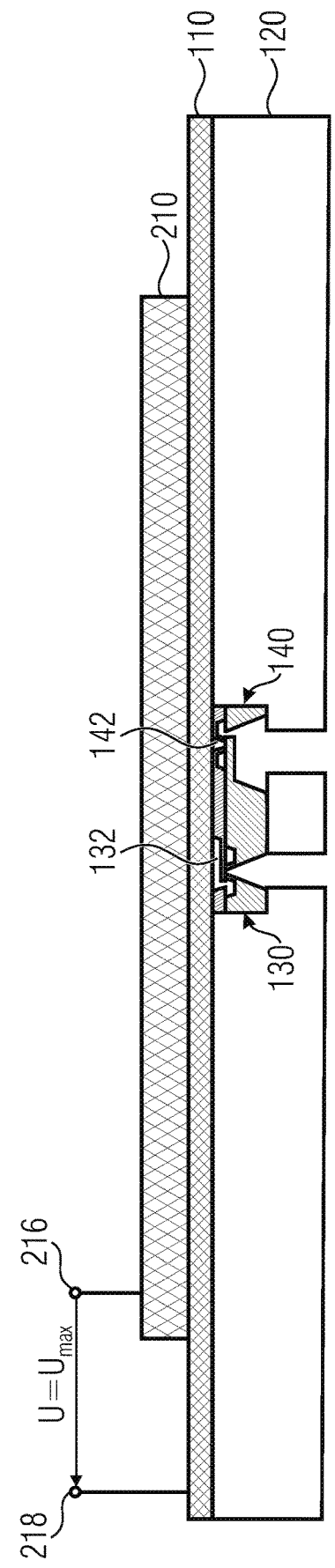
Figure 2A
Figure 2B

PUMP COMPRISING A POLYGON-SHAPED PIEZO DIAPHRAGM TRANSDUCER

CROSS-REFERENCE TO RELATED APPLICATION

This application claims priority from German Application No. 10 2016 201 718.7, which was filed on Feb. 4, 2016, which is incorporated herein in its entirety by this reference thereto.

BACKGROUND OF THE INVENTION

The invention relates to a method for producing a pump, wherein a piezo diaphragm transducer is mounted to a pump body, wherein the method comprises the features of claim 1.

Pumps, and in particular so-called micro pumps, may be produced from different materials, for example, silicon, metals or plastic. Silicon and (partly) metal micro pumps bear a great potential for miniaturization, in particular since pump chambers having small dead volumes may be generated by precise production methods so that, despite small stroke volumes, sufficiently large compression ratios may still be realized.

Piezo diaphragm transducers here are the most widespread drive elements. These are biased advantageously using a special method by applying a high voltage when curing the adhesive. Such a method is known from WO 2011/107162 A1. The chip size of the pump chip processed here is 7×7 mm². The micro pump comprises a square pump chamber. A pump diaphragm, comprising an also square piezo element, is arranged above this square pump chamber. The pump diaphragm comprising the square piezo element is bonded to the underlying pump body along the chip edge. Thus, the minimum of the chip edge necessitated for bonding is 300 μm or more.

Miniaturizing pumps is generally advantageously strived for for the following reasons:
- Smaller pump chips consume less construction space (wherein 7×7 mm² is already small enough for many applications)
- Smaller diaphragm dimensions mean smaller stroke volumes, thereby transporting smaller volume portions
- An important point in miniaturization is reducing the production costs since micro pumps are produced in a wafer compound and, due to miniaturization, more chips can be accommodated on the wafer.

The small stroke volumes are, on the other hand, partly of disadvantage since small stroke volumes result in small compression ratios and the pumps, with too small a compression ratio, would be neither tolerant to bubbles nor self-sucking and, thus, not suitable in practice.

When miniaturizing the pump chip, one difficulty is that the stroke volume of the diaphragm bending transducer is dependent on approximately the fourth power of the lateral dimension of the diaphragm. When halving the diaphragm lateral length of the drive diaphragm, the stroke volume decreases by the factor 16 (when all the other geometry and drive parameters remain the same).

This factor can be reduced to a certain extent by suitably adjusting the geometry and drive parameters. In particular, when reducing the diaphragm lateral length, the diaphragm thickness and, in particular, the thickness of the piezoceramic may also be reduced. However, the stroke volume decreases more than it is possible to decrease the dead volume. Frequently, the dead volume cannot be reduced by the same factor.

This dilemma is aggravated by the fact that the diaphragm area cannot occupy the entire chip area. A chip edge is necessitated for bonding the drive wafer including the pump chamber onto the valve wafer. This minimum chip edge does not depend on the chip size. With known micro pumps having a dimension of 7×7 mm², for example, the chip edge at present is approximately 300 μm, that is 0.6 mm of the 7 mm at the edge of the chip is necessitated for mounting the frame.

If the micro pump were reduced to a chip size of 3.5×3.5 mm², only ⅖ of the chip length would be available for the diaphragm since 300 μm (300 μm each on the left and on the right, that is 600 μm) are still necessitated for the edge.

Another fact of importance when decreasing the chip size is the shape of the diaphragm bending transducer. Micro pumps having a piezo diaphragm transducer, for example, even when biased in accordance with the method known from WO 2011/107162 A1 mentioned above, necessitate a pump chamber comprising a pump chamber height h, below the diaphragm. This pump chamber height is a critical design parameter and contributes decisively to the dead volume of the micro pump, but also the maximum transport rate of the micro pump.

Circular, rotation-symmetrical bending transducers exhibit two advantages compared to bending transducers having a square shape:
- When being deflected, a circular piezo diaphragm transducer, compared to the squared piezo diaphragm transducer, comprises a considerably smaller dead volume with an approximately equal stroke volume, since the pump chamber volume below the corners of the squared diaphragm transducer is not utilized. Conversely, the corner regions of the squared diaphragm transducer contribute almost nothing to the stroke volume.
- A micro pump chip having a circular diaphragm transducer and a circular pump chamber does not only comprise a considerably smaller dead volume but also a considerably greater bond area at the corners of the pump chip. Thus, the minimum distance of the circular pump chamber edge to the chip edge can be reduced considerably, since a sufficient bond area is still available. Thus, with circular diaphragm transducers, a considerably larger chip area may be utilized for the drive diaphragm.

It becomes obvious from what has been stated before that, when reducing the size of the pump chip, a circular piezo diaphragm transducer appears to be of more advantage than a squared piezo diaphragm transducer.

There are two methods known for producing piezoceramics:
a) Block method: piezoceramics here are produced in bars which, after sintering, are sawed into disks, metallized and subsequently polarized
b) Film method: piezoceramics here are drawn into films, sintered, polarized and subsequently diced by sawing.

Using the block method, both circular and squared (or rectangular, triangular, etc.) piezoceramics may be realized, depending on which cross-sectional shape the bars from which the disks are sawed have. However, there is a lower threshold for the thickness of the piezoceramics (at present approximately 150 μm, depending on the piezo manufacturer) below which piezoceramics can no longer be sawed from the bar economically. For micro pump chips smaller than 7×7 mm², ceramic thicknesses smaller than 150 μm are almost always necessitated. In addition, due to handling the ceramics individually, this method is more expensive than the film method. Furthermore, the sawn piezoceramics, after sawing, have to be metallized one by one on the front and back sides.

Piezoceramics below a thickness of 150 µm are thus advantageously produced using the film method, wherein film thicknesses of a thickness below 50 µm may be produced. These ceramic films are metallized on the front and back sides after sintering, and only then diced, which is considerably more economic. Squared metallized piezoceramics with a size of 3×3 mm² can be sawed from a ceramic film (size 60×60 mm², for example) with a thickness of 50 µm using a standard sawing process 400.

For micro pumps with a chip size of 3.5×3.5 mm², which necessitate piezoceramics with a diameter of approximately 3×3 mm² in a thickness of 50 µm, these ceramics produced using the film method can be produced by sawing very economically.

However, circular films cannot be produced in a sawing process, since only straight cuts are possible when sawing. However, as has been explained above, circular piezoceramics are necessitated.

One could try to cut out the sintered metallized film ceramic with a thickness of 50 µm using a laser process or using a punching process to form circular pieces. However, there is no such process available for processing piezoceramics. In addition, the piezoceramic is hard and brittle and would thus very probably be destroyed when using such a method.

What is known is dicing silicon chips glued onto a film substrate by means of laser beams (so-called "stealth dicing"). However, such a technology would have to be developed at first for the piezoceramic. And even if it were available, the individual pieces cut which have a weight of only approximately 3 mg, would have to be placed on the pump chip in the correct polarization direction by a suitable handling system, which causes further considerable practical difficulties. In addition, heating the ceramic results in the ceramic being depolarized close to the cutting edges when exceeding the Curie temperature.

Water jet cutting would be another alternative; however, not only the ceramic but also the film would be severed by the water jet so that the ceramic, after dicing, is present in individual pieces which would have to be sorted again depending on the polarization direction and mounted.

SUMMARY

According to an embodiment, a method for producing a pump, wherein a piezo diaphragm transducer is mounted to a pump body, may have the steps of: providing a pump having a pump chamber and a pump body, wherein the outer circumference of the pump chamber is spaced apart from an outer circumference of the pump body by a distance $B_P$, wherein the distance $B_P$, at the smallest location, is at most 300 µm, providing a piezoceramic layer, dicing at least one piezo element from the piezoceramic layer so that the at least one piezo element has a regular polygon shape having at least six corners, and forming the piezo diaphragm transducer by mounting the piezo element to a pump diaphragm.

Another embodiment may have a a pump having a piezo diaphragm transducer arranged at a pump body of the pump, wherein the piezo diaphragm transducer has a piezo element produced from a piezoceramic layer and arranged at a diaphragm, wherein the piezo element has a regular polygon shape having at least six corners, and wherein the pump has a pump chamber, the outer circumference of which is spaced apart from an outer circumference of the pump body by a distance $B_P$, wherein the distance $B_P$, at the smallest location, is at most 300 µm.

Using the inventive method, a pump is provided, wherein a piezo diaphragm transducer is arranged at a pump body. The piezo diaphragm transducer comprises a pump diaphragm and a piezo element arranged thereon. In accordance with the invention, the piezo element comprises a regular polygon shape having at least six corners. The inventive method is of advantage in that a pump, for example a micro diaphragm pump for transporting small and the smallest quantities in the microliter or nanoliter region, can be produced, wherein the micro diaphragm pump comprises a piezo element as a drive element for driving and/or deflecting the diaphragm. The piezo element comprises a polygon shape having at least six corners. Known pumps having rectangular or squared pump chambers and rectangular or squared piezo elements comprise dead volumes in the corners which do not contribute to transport, since the pump chamber volume below the corners of the square piezo element cannot be utilized. The corner regions of a quadrangular or squared piezo element conversely hardly contribute to the stroke volume. In comparison, the inventive polygon-shaped piezo element having at least six corners, in particular with circular pump chambers, comprises a considerably smaller dead volume with an approximately equal stroke volume. Among others, this results from the fact that the polygon-shaped design of the piezo element can be adjusted to the circular shape of the pump chamber. In other words, a circumcircle around an inventive regular polygon-shaped piezo element can be defined the diameter of which is adjustable to the diameter of the circular pump chamber. Thus, a large stroke volume comprising a considerably smaller dead volume when compared to quadrangular piezo elements may be utilized.

In accordance with an embodiment, the step of mounting the piezo element to the pump diaphragm for forming the piezo diaphragm transducer may be performed after a step of mounting the pump diaphragm to the pump body. In other words, at first the pump diaphragm is mounted to the pump body. Only afterwards, the piezo element is arranged at the pump diaphragm. The combination of pump diaphragm and piezo element results in the piezo diaphragm transducer arranged at the pump body.

In accordance with an alternative embodiment, the step of mounting the piezo element to the pump diaphragm for forming the piezo diaphragm transducer may be performed before a step of mounting the pump diaphragm to the pump body. In other words, at first the piezo element is arranged at the pump diaphragm. The combination of pump diaphragm and piezo element results in the piezo diaphragm transducer which subsequently is mounted to the pump body.

It is conceivable for dicing the at least one piezo element from the piezoceramic layer to take place such that the at least one piezo element comprises an even number of polygon corners. Piezo elements having a regular polygon shape and an even number of polygon corners can be diced from a piezoceramic layer with only little scrap. The scrap is smaller than with piezo elements to be diced having an odd number of polygon corners.

It is conceivable for dicing the at least one piezo element from the piezoceramic layer to take place such that the at least one piezo element comprises at least eight corners. The more corners the polygon-shaped piezo element has, the better can the characteristics of a circular piezo element be represented. Compared to a, for example, quadrangular piezo element, an octagonal piezo element comprises a smaller dead volume, that is the usable volume is greater.

In accordance with an embodiment, when dicing the piezo element, the piezo element is sawn from the piezoceramic layer in straight cuts along a defined sawing pattern. In some embodiments, the at least one piezo element is sawn from the piezoceramic layer using exclusively straight cuts. Thus, standard sawing processes may be used for sawing the piezo element from the piezoceramic layer. Using sawing processes, in particular straight cuts can be performed in an advantageous, simple and efficient manner. Such sawing processes are suitable for mass production, that is the inventive polygon piezo elements can be produced in a cost-efficient manner and in large numbers.

It is conceivable to cut, when dicing the piezo element, the piezo element from the piezoceramic layer along a defined cutting pattern by means of a beam or jet cutting method. The piezo elements may, for example, be diced using laser beam or water jet cutting. Apart from straight cuts, non-straight cuts may also be performed here. Using such a beam or jet cutting method, a polygon piezo element may, for example, be cut from the piezoceramic layer with no scrap remaining. With hexagonal shapes, a honeycomb-shaped structure may, for example, be cut out.

It is conceivable for the piezoceramic layer to be a polarized piezoceramic film. Such piezoceramic films polarized before make producing polarized piezo elements by means of the film method easier. The piezo elements diced from the polarized film already exhibit a correct polarization and do not have to be polarized separately after dicing.

In accordance with an embodiment, the diaphragm is biased so that the diaphragm, in an unactuated state, is spaced apart from the pump body at least in portions and that this spaced-apart region forms a pump chamber having an annular shape in top view. Annular, and, in particular, circular pump chambers result in an improved efficiency of the pump to be produced compared to quadrangular or squared pump chambers. The polygon-shaped piezo element which is mounted to the biased diaphragm may be flexible and comprise approximately the same or somewhat smaller outer dimensions (circumcircle diameter) compared to the circular pump chamber (diameter of the pump chamber). In addition, biasing the diaphragm may be adjusted to a desired pump chamber height H so that the volume transported per pump stroke can be adjusted as necessitated.

It is also conceivable for the method to further comprise forming a pump chamber of an annular shape in top view in the pump, wherein the pump chamber is configured such that its outer circumference is spaced apart from an outer circumference of the pump body so that a smallest distance is at most 300, 200 or 100 µm. In other words, the chip edge of a pump chip with an annular pump chamber can be reduced compared to quadrangular or squared pump chambers. The chip edge is the distance between the outer circumference of the pump chamber (diameter D of the pump chamber) and the outer circumference (or outer side) of the pump body. This means that the smallest distance is where the outer circumference of the pump chamber has a minimum distance to the outer circumference of the pump body. This smallest distance is 300 µm or less, 200 µm or less or 100 µm or less. In comparison, the minimum dimension of a chip edge in known quadrangular or squared pump chambers is at least 300 µm or more in order to provide a sufficient bond area for bonding the diaphragm to the chip edge. By virtue of the inventive annular, and, in particular, circular, pump chamber, there is more bond area available in the corners so that the dimensions of the chip edge may be reduced.

In addition, the invention is directed to a pump.

It is conceivable for the piezo element to comprise a thickness of 100 µm or less, and advantageously 50 µm or less. Such a piezo element may, for example, be produced using a film technique, wherein piezoceramics are drawn into films, sintered and polarized. Subsequently, piezo elements can be diced from such films by sawing. In particular, when reducing the size of micro pumps in a chip construction, at the same time the diaphragm and the piezo element arranged thereon are to be reduced as well. For maintaining the stroke volume, in particular the thickness of the piezo element has to be reduced, wherein a thickness of approximately 50 µm or less is well suited here.

In accordance with an embodiment, the pump may be a micro diaphragm pump, the pump body of which is formed as a chip comprising a metal or comprising a semiconductor material. Such micro diaphragm pumps produced in a chip construction exhibit a high potential for miniaturization.

It is conceivable for the pump body to comprise a size of 7×7 mm$^2$ or less, 3.5×3.5 mm$^2$ or less or 2×2 mm$^2$ or less. When miniaturizing the pump or pump body, one difficulty is that the stroke volume of the piezo diaphragm transducer is dependent on approximately the fourth power of the lateral dimension of the diaphragm. When, for example, halving the lateral length of the diaphragm, the stroke volume is reduced by the factor 16. An inventive polygon-shaped piezo element can compensate or reduce at least partly these disadvantages connected to miniaturization. Thus, using an inventive polygon-shaped piezo element is of advantage for miniaturized pumps.

It is also conceivable for the pump to comprise a pump chamber of an annular shape in top view, the outer circumference of which is spaced apart from an outer circumference of the pump body such that a smallest distance is at most 300 µm, or at most 200 µm or at most 100 µm, or at most 50 µm. In other words, an edge where the diaphragm may be mounted remains between the pump body and the pump chamber. With a micro diaphragm pump produced in a chip construction, for example, where the micro pump chip (except for the piezo) is produced from silicon in a wafer compound, this is called a chip edge. With known micro diaphragm pumps with a quadrangular or squared pump chamber, the circumferential chip edge is 300 µm or more. By forming a circular pump chamber, the chip edge can be reduced to a size of 300 µm, 200 µm, 100 µm, or 50 µm or less.

BRIEF DESCRIPTION OF THE DRAWINGS

Embodiments of the invention are illustrated in the figures and will be discussed below, in which:

FIG. 1E is a cross-sectional view of an inventive pump comprising a biased diaphragm without showing an inventive piezo element, FIG. 1F is a cross-sectional view of an inventive pump comprising a diaphragm adjacent to the pump body without showing an inventive piezo element, FIG. 2A is a cross-sectional view of an inventive pump comprising a biased diaphragm and an inventive polygon-shaped piezo element having at least six corners, FIG. 2B is a cross-sectional view of an inventive pump comprising a diaphragm adjacent to the pump body and an inventive piezo element.

DETAILED DESCRIPTION OF THE INVENTION

Figure 1A:
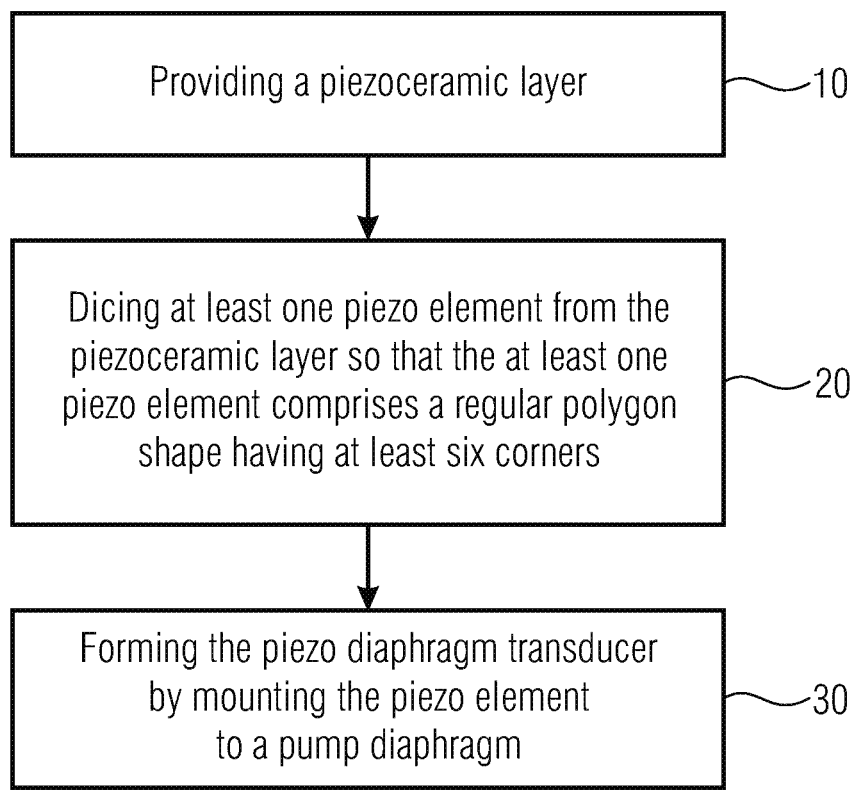
FIG. 1A is a block diagram of an inventive method.

FIG. 1A shows a block diagram of an inventive method for producing a pump, wherein a piezo diaphragm transducer is mounted to a pump body. The inventive method may also be executed in a different order from that shown in FIG. 1A.

In accordance with block 10, a piezoceramic layer is provided. The piezoceramic layer may be a piezoceramic film. The piezoceramic layer may comprise a thickness or height of 50 µm or less.

In accordance with block 20, at least one piezo element is diced from the piezoceramic layer so that the at least one piezo element comprises a regular polygon shape having at least six corners.

In accordance with block 30, the piezo diaphragm transducer is formed by mounting the piezo element to a pump diaphragm. In accordance with the invention, this piezo diaphragm transducer is mounted to a pump body of the pump.

In accordance with an embodiment of the inventive method, the pump diaphragm may, at first, be arranged at the pump body. Subsequently, the piezo element may be arranged at the pump diaphragm.

In accordance with an alternative embodiment of the inventive method, the piezo element may also be arranged at the pump diaphragm at first. Subsequently, the pump diaphragm including the piezo element arranged thereon may be arranged at the pump body of the pump.

The piezo element, in connection with the pump diaphragm, forms the piezo diaphragm transducer.

The pump body may exemplarily be a pump body of a micro diaphragm pump made from a semiconductor material, for example silicon, in a chip construction. Such a pump body may comprise a valve wafer, for example. The pump diaphragm may, for example, also include a semiconductor material, for example silicon, and be produced by means of a grinding process, for example. Exemplarily, the pump diaphragm may be arranged above the valve wafer and thus form a drive wafer. Exemplarily, the pump diaphragm may be spaced apart from the pump body by biasing the pump diaphragm. The pump chamber may exemplarily be provided by this spacing.

As has been mentioned above, the piezo diaphragm transducer is formed by mounting the at least one piezo element to the pump diaphragm. As has been described before, the pump diaphragm may be arranged at a pump body. The pump diaphragm may be actuated by means of the piezo element so that the movement of the pump diaphragm corresponds to a pump stroke. The pump diaphragm and the piezo element arranged there together form the piezo diaphragm transducer.

Figure 1B:
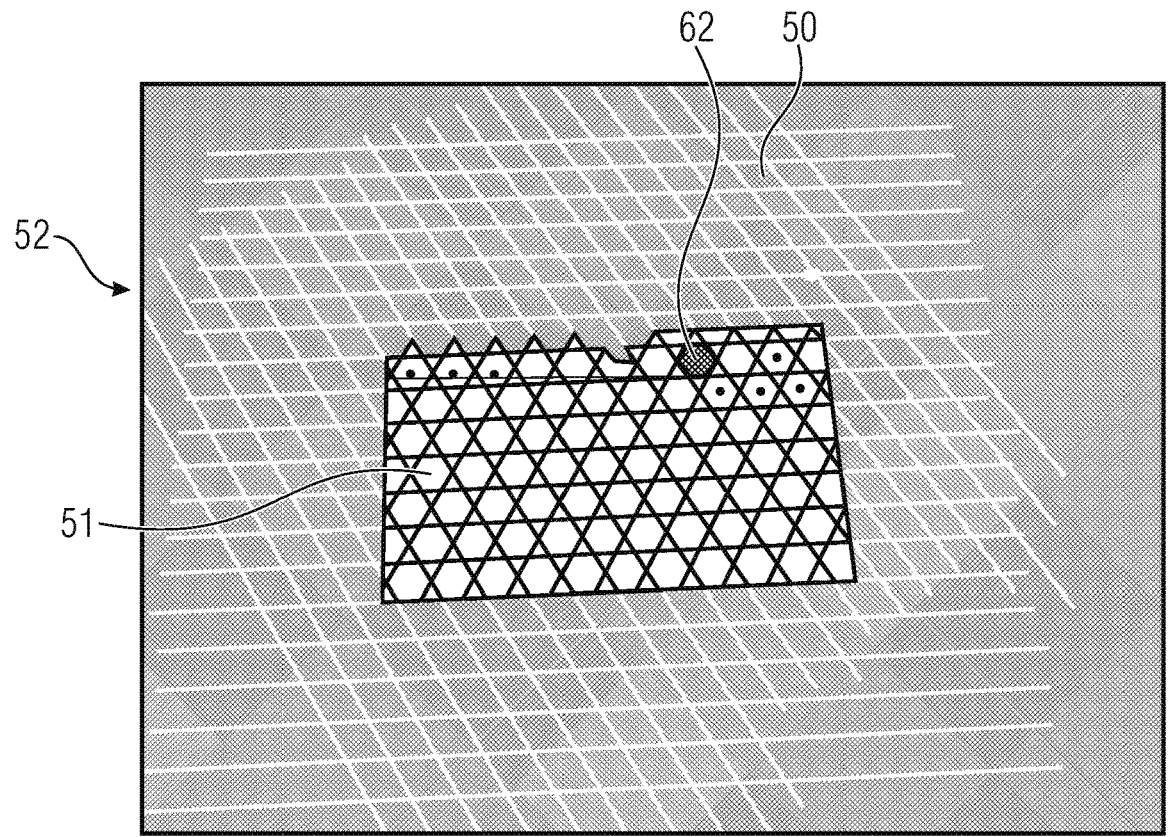
FIG. 1B shows a piezoceramic layer arranged on a sawing film with a cutting or sawing pattern.
Figure 1C:
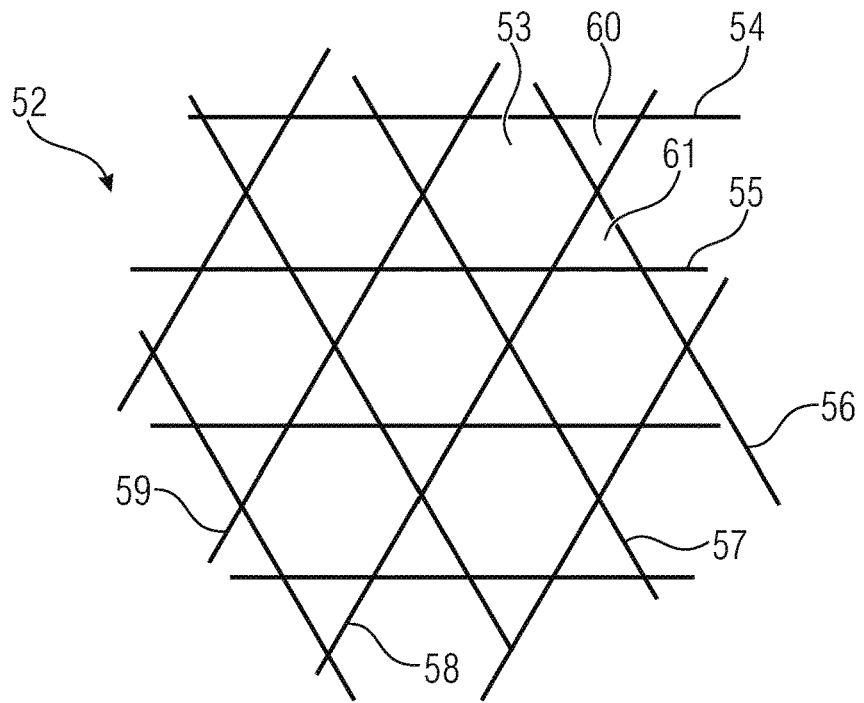
FIG. 1C is a schematic illustration of a possible cutting or sawing pattern for producing a hexagonal piezo element by means of exclusively straight cuts.

In accordance with the invention, the piezo element, when dicing, is sawn from the piezoceramic layer in straight cuts along a defined sawing pattern. FIG. 1B shows a piezoceramic layer 51 arranged on a film 50.

The film 50 and the piezoceramic layer 51 arranged thereon are sawn in straight cuts along a defined sawing or cutting pattern 52. The sawing or cutting pattern 52 is shown schematically in an enlarged illustration in FIG. 10.

The sawing or cutting pattern 52 is configured such that only straight sawing cuts are provided. The sawing or cutting pattern 52 comprises at least a first pair of parallel cutting lines 54, 55, at least a second pair of cutting lines 57, 58 diagonal thereto, and at least a third pair of cutting lines 58, 59 diagonal thereto in a mirrored manner. The pairs of cutting lines are each parallel to each other.

By this arrangement of the cutting lines, a diced piezo element 53 is obtained from the piezoceramic layer 51, which comprises the shape of a regular hexagonal polygon. The scrap, so to speak, is two triangles 60, 61.

As can be seen from FIG. 1B, such a hexagonal piezo element has already been separated or diced from the piezoceramic layer 51, which can be recognized from the blank 62.

Sawing piezo films is a standardized process step suitable for mass production so that a piezo element may be produced economically. Advantageously, a ceramic layer polarized before may be used. After sawing, the polarized ceramic 51 may be placed from the sawing film 50 onto a pump body (FIG. 1E and following) or a pump chip by means of a pick-and-place technology, for example.

The film ceramic 51 is diced by a standard sawing process, but not to form a squared shape, but, by the straight cuts, a hexagonal shape.

The hexagonal shape of the piezo element 53 has the following advantages:

Like a square, the hexagon 53 may be sawn from a planar plate using straight cuts.

What remains is two small triangles 60, 61 per hexagon 53 which means that 75% of the ceramic film area may be utilized for the hexagon 53. The sawn piezoceramics 53 may be placed directly from the sawing film 50, at a correct polarization direction, onto a pump body, for example a micro pump wafer, using a pick-and-place system.

The hexagon 53 is much better adjusted to an ideal circular shape than a square. Thus, a circular pump chamber may be chosen (below the hexagonal ceramic 53), thereby producing the advantages mentioned above.

Figure 1D:
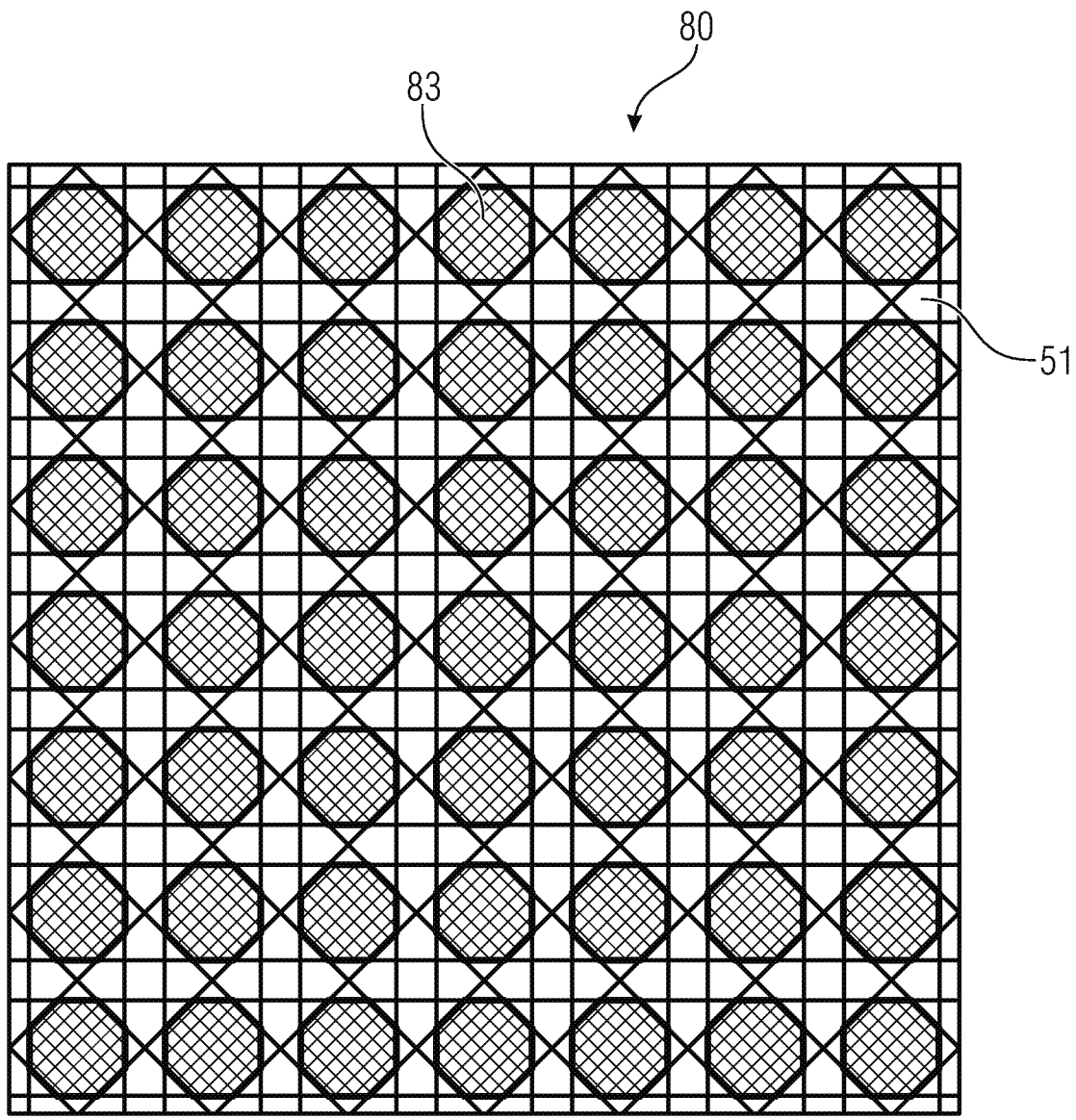
FIG. 1D is a schematic illustration of a possible cutting or sawing pattern for producing an octagonal piezo element by means of exclusively straight cuts.

FIG. 1D shows another possible sawing or cutting pattern 80 along which a piezoceramic layer 51 may be sawn or cut. This sawing or cutting pattern 80 may be used to cut or saw from the piezoceramic layer 51 at least one octagonal inventive piezo element 83 using straight cuts, dicing taking place afterwards.

As has been mentioned before, the sawn or cut polygon-shaped piezo elements 53, 83 may be arranged at a pump diaphragm. The piezo elements 53, 83 are configured to deflect the pump diaphragm in at least one direction. The piezo elements 53, 83, together with the pump diaphragm which they are mounted to, form a piezo diaphragm transducer for a pump.

FIG. 1E shows a reduced illustration of an inventive pump 100, wherein, for simplifying the discussion of the basic structure of the pump 100, the inventive piezo element has not been marked.

The pump 100 shown in FIG. 1E comprises a pump body 120 and a diaphragm 110 arranged thereon. The pump diaphragm 110 is biased in the position shown in FIG. 1E, that is spaced apart from the pump body 120 at least in portions. This corresponds to an unactuated or inactive starting state of the pump 100, whereas, in FIG. 1F, the diaphragm 110 has been actuated by means of a piezo element (not yet shown).

The pump diaphragm 110 comprises a first or top surface 112 and a second or bottom surface 114 arranged opposite the first surface 112. The pump body 120 comprises a first or top surface 122 and a second or bottom surface 124 arranged opposite the first surface 122. The pump diaphragm 110 is arranged at the pump body 120 along its circumference.

In addition, the pump 100 comprises a pump chamber 102 (FIG. 1E), wherein the pump chamber 102 is defined as the free space or volume between the pump diaphragm 110 and the pump body 120. The pump chamber 102 here exemplarily comprises a diameter D. The diameter D of the pump chamber 102 is defined by the distance between two opposite lateral positions of the pump 100 where the pump diaphragm 110—in a non-actuated biased state—touches the pump body 120, which typically corresponds to those positions where the pump diaphragm 110 is arranged at the pump body 120 along its circumference.

The reference numeral H refers to the height of the pump chamber 102 in a non-actuated state, that is the vertical distance between the first surface 122 of the pump body 120 and the lower surface 114 of the pump diaphragm 110 in the center 103 of the pump diaphragm 110.

The pump body 120 comprises an inlet 126 and an outlet 128 and a cavity on the top side of the pump body 120, that is on the side facing the pump diaphragm 110, where a first valve 130 and a second valve 140 are arranged. The first valve 130 and the second valve 140 are in fluid connection to the pump chamber 102.

In the embodiment of the micro pump 100 shown here, the inlet-side check valve 130 and the outlet-side check valve 140 are implemented in the form of a stack 170 of two semiconductor chips 150, 160, wherein the top semiconductor layer or chip 150 of the double valve structure 170 is arranged above the bottom semiconductor layer or chip 160. The first and/or second semiconductor layer 150, 160 may, for example, comprise silicon or other semiconductor materials.

As can be recognized from FIGS. 1E and 1F, the first surface 122 of the pump body 120 is planar and a top surface 152 of the inlet and outlet valve 130, 140 or, in other words, a top surface 152 of the top layer 150 facing the pump diaphragm 110, is also planar and located at the same height as the first surface 122, when referring to a vertical orientation in FIG. 1E. Below the common plane (defined by the surfaces 122, 152), the inlet-side check valve 130 comprises a cavity 132, for example a cavity formed in the top and bottom layers 150, 160, and the outlet-side check valve 140 comprises a cavity 142, for example in the top layer 150.

Although FIGS. 1E and 1F show a pump body 120 with a double valve structure 170 used, different embodiments of the pump may comprise valve structures 130, 140 which are patterned directly in the pump. In further embodiments, the top surface 152 of the valve structure 170 may already form the pump body 120 (see, for example, FIGS. 4A to 4E).

Subsequently, the first surface 122 of the pump body 120 and the top surface 152 of the inlet-side and outlet-side check valves 130, 140 together are also referred to as a first surface of a pump body or pump body bottom. The micro pump 100 illustrated in FIGS. 1E and 1F comprises a basically planar first surface 122 and a basically planar pump body bottom, that is a first surface 122 comprising a planar implementation, except for the cavities 132, 142 of the valves.

It is to be mentioned in this context that a maximum volume $V_{max}$ of the pump chamber 102 comprises the volume between the pump volume 120 and the pump diaphragm 110, as is shown in FIG. 1E in the biased state, and the volumes of the valve cavities 132, 142.

As can additionally be recognized from FIG. 1F, in embodiments where the pump diaphragm 110 is assumed to have a planar shape within the second, less biased position and abuts on the first surface 122 of the pump body 120, the minimum or dead volume $V_0$ is determined mainly by the valve cavities 132, 142. The difference between the two volumes is also referred to as the stroke volume $\Delta V = V_{max} - V_0$. Since the compression ratio c is defined as $c = \Delta V/V_0$, the embodiments shown in FIGS. 1E and 1F comprise high compression ratios.

In this example, the pump chamber 102 is sealed completely relative to its surroundings (except for the inlet-side check valve 130 and the outlet-side check valve 140) by means of a connection between the pump diaphragm 110 and the pump body 120 along the circumference of the pump diaphragm 110. The circumference of the pump diaphragm 110 may comprise an angular shape, any point-symmetrical shape or any other shape. An angular or point-symmetrical circumference of the pump diaphragm 110 results in an improved pump characteristic since these shapes avoid deformation during movement.

FIGS. 2A and 2B schematically show a cross-section of an embodiment of a pump 200 which comprises a piezo element 210 arranged on the top side 112 of the pump diaphragm 110. In analogy to FIG. 1E, FIG. 2A shows the pump 200 with the pump diaphragm 110 in a first biased position. In analogy to FIG. 1F, FIG. 2B shows the pump 200 with the pump diaphragm 110 in a second, that is less biased, position, in this case in a planar position.

FIG. 2A also shows the inventive pump 200 with a piezo diaphragm transducer 101 arranged at a pump body 120 of the pump 200. The piezo diaphragm transducer 101 comprises a piezo element 210 produced from a piezoceramic layer and arranged at a diaphragm 110. In accordance with the invention, the piezo element 210 comprises a regular polygon shape having at least six corners. Since the polygon shape of the piezo element 210 cannot be recognized in the present sectional view, reference in this regard is made to the top view shown in FIG. 3.

Figure 3:
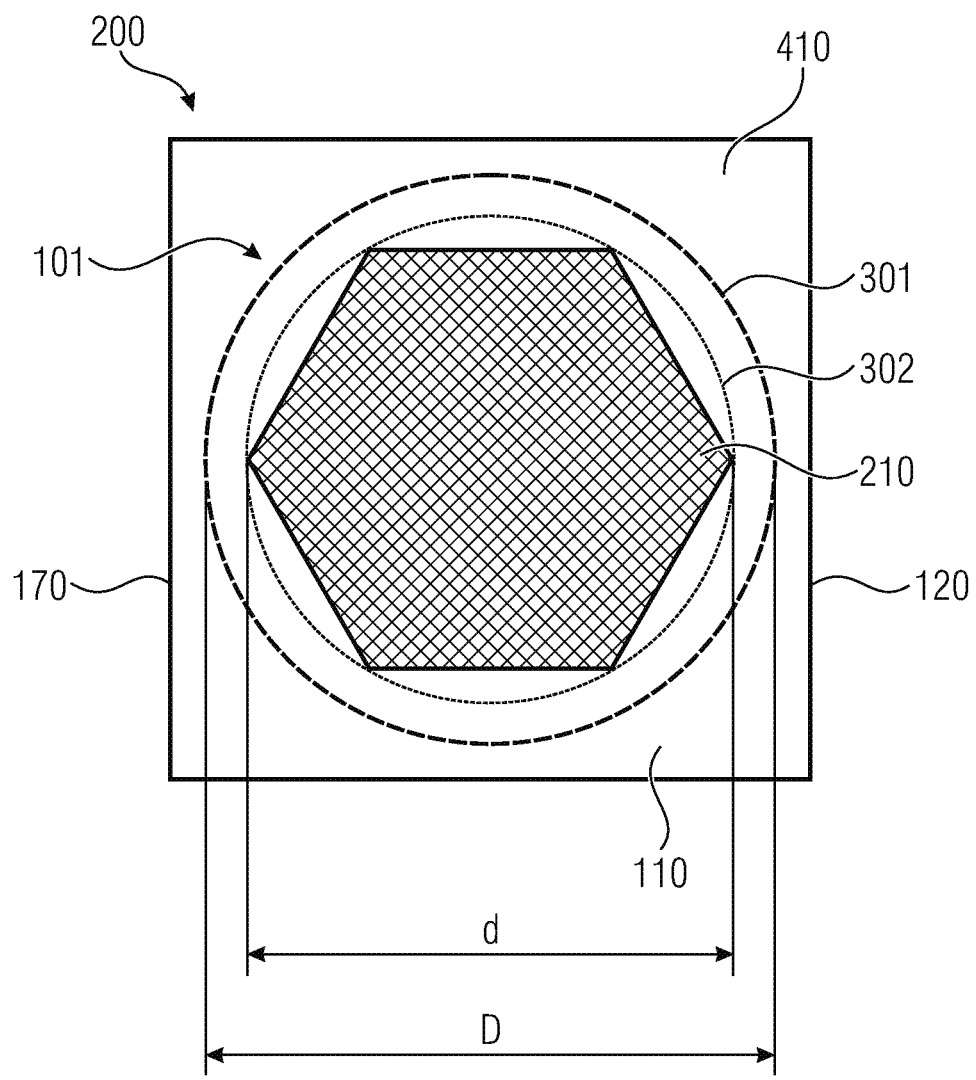
FIG. 3 is a top view of an inventive pump comprising an inventive hexagonal piezo element.

The polygon shape of the piezo element 210 shown in FIGS. 2A and 2B thus can be recognized in the top view shown in FIG. 3. In accordance with FIG. 3, the micro pump 200 comprises the pump body 120. As has been discussed before relating to FIG. 1E, the pump chamber 102 is formed between the pump body 120 and the overlying biased diaphragm 110. In this example, the pump chamber 102 comprises a circular shape which is represented by the outer broken-line circle 301. The circular pump chamber 102 comprises a diameter D.

The diaphragm 110 is arranged on the top side of the pump chamber 102 facing the observer. The diaphragm 110 in this example is tensioned completely over the lateral dimensions of the pump body 102 and attached thereto. The piezo element 210 is arranged on the top side of the diaphragm 110 facing the observer. The piezo element 210 and the diaphragm 110 together form the inventive piezo diaphragm transducer 101.

The piezo element 210 is produced from a piezoceramic layer and comprises a hexagonal shape. More precisely, the piezo element 210 comprises a regular polygon shape having an even number of polygon corners of six corners. A regular polygon shape here means a polygon which is both equilateral and equiangular.

A circumcircle 302 of a diameter d can be defined around the polygon-shaped piezo element 210. The diameter d of the circumcircle 302 is smaller than the diameter D of the pump chamber 102.

As can be recognized in FIGS. 2A and 2B, the piezo element 210 comprises a top electrode on the first surface 212 (also referred to as top or top-most surface). Additionally, the piezo element 210 comprises a bottom electrode on the second surface 214 (also referred to as bottom or bottom-most surface), wherein the second surface 214 is arranged on the opposite main surface of the piezo element 210. The top-most electrode of the piezo element 210 is connected electrically to a first contact 216 and the bottom-most electrode of the piezo element 210 is connected electrically to a second contact 218 of the pump, for example by means of a conducting layer which may be applied at least on a part of the first surface 112 of the pump diaphragm 110.

The piezo element 210 may, for example, be bonded to the pump diaphragm 110 by means of an adhesive or another bonding technique. The piezo element 210 is polarized so that the piezo element 210, in the case of a positive electrical voltage applied between the top electrode 216 and the bottom electrode 218, contracts laterally and thus deflects the biased pump diaphragm 110 downwards, that is in the direction towards the pump body 120.

In FIG. 2A, there is no electrical voltage (U=0V) applied to the electrodes 216, 218. Consequently, the piezo element 210 is not activated here and the biased diaphragm 110 remains in its biased position.

In FIG. 2B, there is a positive electrical voltage applied, for example $U=U_{max}$. Consequently, the pump diaphragm 110 is deflected downwards, that is in the direction towards the pump body 120, and contacts with the planar pump body 120.

Moving the pump diaphragm 110 from the first biased position to the second planar position may be achieved in different ways by means of an inventive piezo element 53, 83, 210, for example by means of a piezoceramic 210 or other piezo drives, for example by means of piezo stack actuators which are glued onto the pump diaphragm, as has been mentioned before referring to FIGS. 2A and 2B, wherein these piezo drives, when applying a positive voltage, contract laterally and relax laterally when there is no voltage applied. In addition, these piezo drives extend beyond their lateral length or dimension present in the relaxed state, when a negative voltage is applied. In other embodiments, applying the force on the pump diaphragm may be done by means of a piezo stack actuator which is bonded permanently to the pump diaphragm.

FIGS. 4A to 4E show cross-sectional views of another embodiment of a pump 400 comprising a pump diaphragm 110, wherein the two-layered valve structure 170, described before relating to FIG. 1E, now forms the pump chamber 120, and wherein the pump chamber 110 is implemented in the form of a patterned and at least partly thinned third layer 410.

Figure 4A:
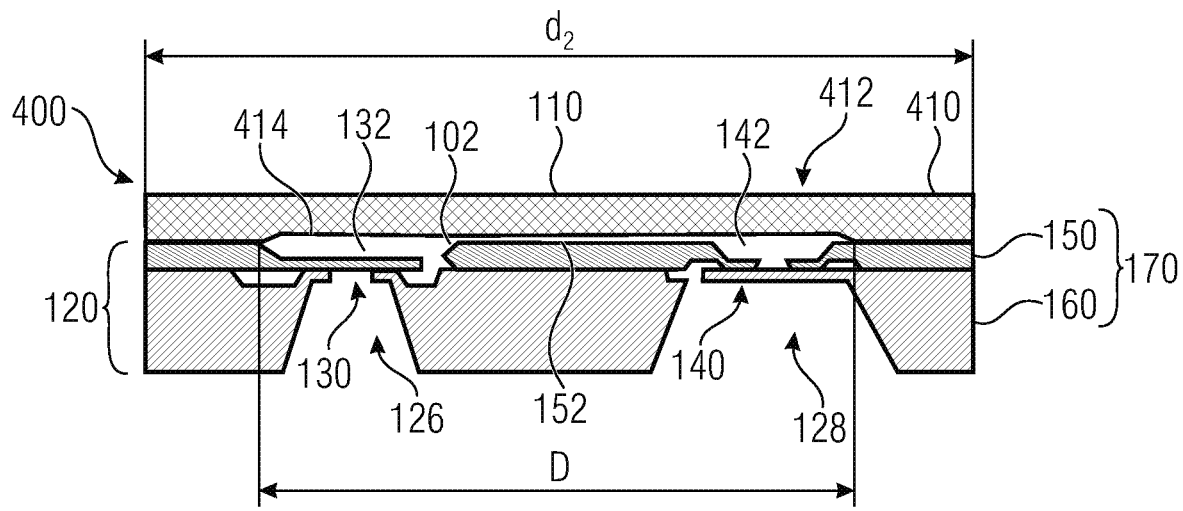
FIG. 4A is a cross-sectional view of another embodiment of an inventive pump without showing an inventive piezo element.

As can be recognized from FIG. 4A, the third layer 410 comprises a top or first surface 412, wherein the third layer 410 forms a flexible pump diaphragm 110. The third layer 410 is slightly thinned in the region of the bottom or second surface 414 arranged opposite the first surface 412, in an approximately center region around the valves 130, 140.

The upper region 412 comprises a lateral length $d_2$. In the case of a circular pump body 120 or a circular pump diaphragm 110, the upper region 412 would correspondingly comprise a diameter of a dimension $d_2$. The bottom thinned region forms the pump chamber 102 and comprising a lateral length or diameter D. The pump chamber 102 may be implemented to be annular and, in particular, circular.

The lateral length or diameter $d_2$ of the first or top surface 412 is greater than the lateral length or diameter D of the second or bottom surface 414. The pump diaphragm 110 or the third layer 410 and the pump body 170 are connected to one another such that the pump chamber 102 is defined between the pump body 170 and the pump diaphragm 110.

FIG. 4A shows the pump 400 in a state before a piezo element is bonded to the diaphragm 110 and the same is deflected.

Figure 4B:
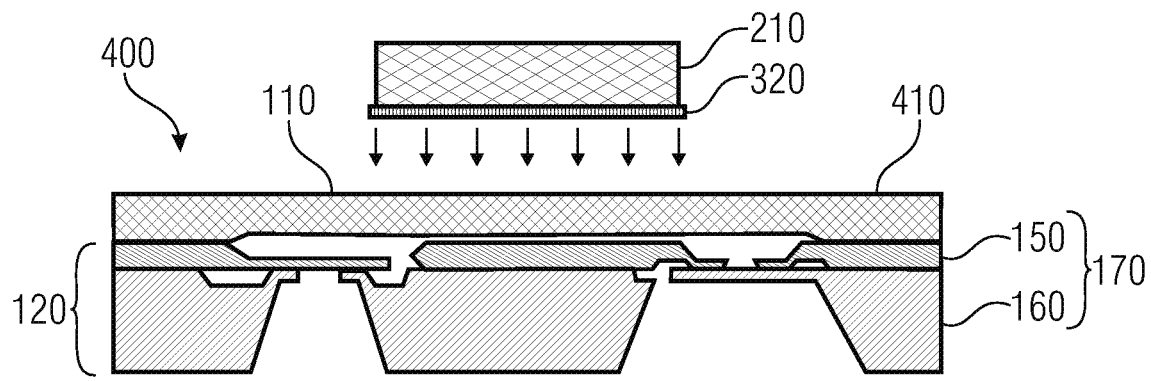
FIG. 4B is a cross-sectional view of the other embodiment of the inventive pump in a step of mounting an inventive piezo element.

In FIG. 4B, a piezo element 210 is mounted to the topside of the pump diaphragm 110 by means of an adhesive layer 320 applied on its lower side.

Figure 4C:
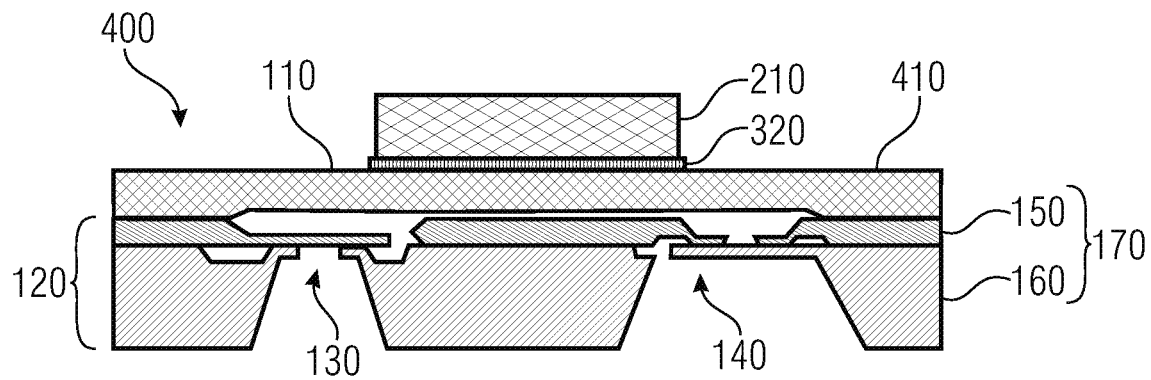
FIG. 4C is a cross-sectional view of the other embodiment of the inventive pump with a piezo element mounted to the diaphragm.

FIG. 4C shows the pump with a piezo element 210 arranged on the pump diaphragm 110 and an adhesive layer 320 arranged between the pump diaphragm 110 and the piezo element 210.

In accordance with the invention, the piezo element 410 illustrated in a cross-sectional view in FIGS. 4A to 4C also comprises a regular polygon shape having at least 6 corners. In this regard, reference is again made to the top view of the inventive pump illustrated in FIG. 3 where the polygon shape of the piezo element 210 can be recognized clearly.

In FIG. 3 and in FIGS. 4A to 4E, the pump comprises the pump body 170 which comprises a first layer 160 and a second layer 150 arranged above it. The third layer 410 which forms the pump chamber 102 in its thinned region facing away from the observer is arranged above the second layer 150.

The pump chamber 102 is thus formed between the pump body 170 and the diaphragm 110. In this example, the pump chamber 102 comprises a circular shape which is illustrated by the outer broken-line circle. The circular pump chamber 102 comprises a diameter D.

The polygon-shaped piezo element 210 is arranged on the topside of the diaphragm 110 facing the observer. The piezo element 210 and the diaphragm 110 together form the inventive piezo diaphragm transducer 101.

The piezo element 210 is produced from a piezoceramic layer and comprises a hexagonal shape. More precisely, the piezo element 210 comprises a regular polygon shape comprising an even number of polygon corners of 6 corners.

A circumcircle 302 having a diameter d can be defined around the polygon-shaped piezo element 210. The diameter d of the circumcircle 302 is smaller than the diameter D of the pump chamber 102.

Figure 4D:
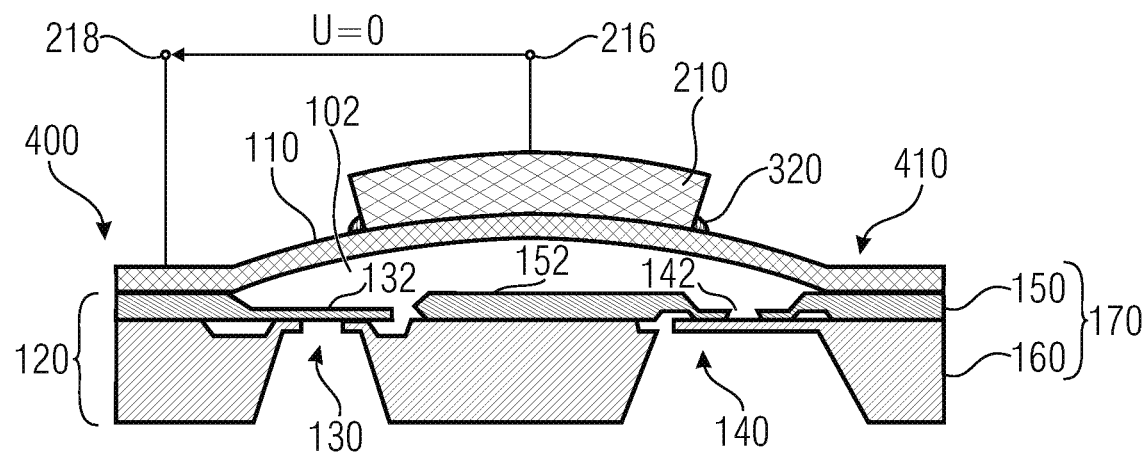
FIG. 4D is a cross-sectional view of the other embodiment of the inventive pump with a biased diaphragm.

FIG. 4D shows another cross-sectional view of the inventive pump 400 comprising a polygon-shaped piezo element 210 which is arranged at the pump diaphragm 110 by means of an adhesive 320. In this embodiment, the pump diaphragm 110 is also biased, which means that, if there is no electrical voltage applied to the piezo element 210, the pump diaphragm 110 is in its biased starting position as illustrated.

Figure 4E:
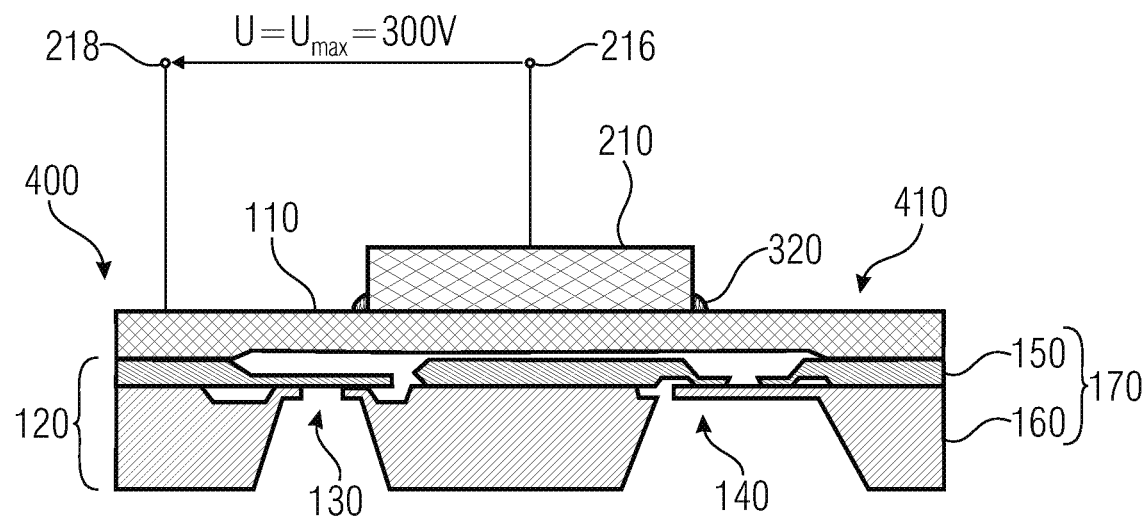
FIG. 4E is a cross-sectional view of the other embodiment of the inventive pump with an actuated diaphragm.

In FIG. 4E, a voltage is applied, for example, $U=U_{max}=300$ V. The piezo element 210 contracts laterally and thus pushes the pump diaphragm 110 in the direction towards the pump body 170. This means that a pump stroke is performed where a medium to be transported is transported from the inlet 130 to the outlet 140.

Even when the previous embodiments so far have been described such that the pump diaphragm 410 is at first bonded to the pump body 170 and subsequently biased, in alternative embodiments, a pump diaphragm 410 biased already may be bonded to the pump body 170. In alternative embodiments, it is also conceivable for the pump diaphragm 110 not to be biased. In such a case, the pump diaphragm 110 is positioned adjacent to the pump body 120, 170 in its starting position (FIGS. 2B, 4C), and when applying an electrical voltage, the pump diaphragm 110 bulges outwards, that is the pump diaphragm 110 moves away from the pump body 120, 170 (FIGS. 2A, 4D).

As has been described before referring to the figures, in accordance with the invention, the piezo diaphragm transducer 101 is formed by the polygon-shaped piezo element 53, 83, 210 to be mounted to a pump diaphragm 110. It is also conceivable for further piezo elements to be mounted to the diaphragm 110, apart from this polygon-shaped piezo element 53, 83, 210. Advantageously, but not necessarily, these additional piezo elements may also comprise a regular polygon shape.

As mentioned, a piezo diaphragm transducer 101 comprises a pump diaphragm 110 and a piezo element 53, 83, 210 arranged there. A pump which may be produced using the inventive method comprises at least one piezo diaphragm transducer 101 comprising a regular polygon-shaped piezo element 53, 83, 210, wherein this piezo diaphragm transducer 101 is mounted to the pump body 120, 170. However, it is also conceivable for several piezo diaphragm transducers to be mounted to the pump body 120, 170. This means that several diaphragms (or also a diaphragm subdivided into several portions) having each at least one piezo element may be arranged at the pump body 120, 170. Advantageously, but not necessarily, the piezo elements arranged at the additional diaphragms or diaphragm portions may also comprise a regular polygon shape.

Thus, a peristaltic pump, as is described in DE 102 38 600 A1, for example, may be equipped with several inventive piezo diaphragm transducers 101. Exemplarily, a first piezo diaphragm transducer mounted to the pump body may form an inlet valve together with a first fluid passage. A second piezo diaphragm transducer mounted to the pump body may, for example, form an inlet valve together with a second fluid passage. A third piezo diaphragm transducer mounted to the pump body may, for example, form a pump chamber together with a part of the pump body. In accordance with the invention, at least one of the piezo diaphragm transducers comprises a piezo element having a regular polygon shape.

Advantageously, at least two, or even all the other piezo diaphragm transducers may each comprise a piezo element having a regular polygon shape.

An advantage of the inventive polygon-shaped piezo element 53, 83, 210 will be described below referring to FIGS. 5A, 5B and 5C.

Figure 5A:
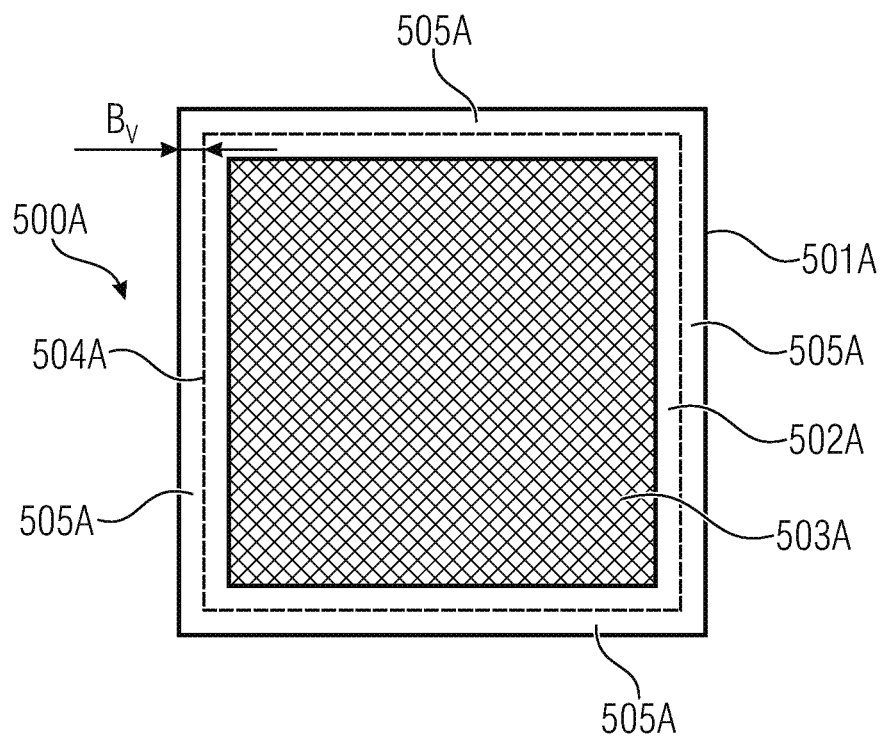
FIG. 5A is a top view of a pump comprising a quadrangular or squared pump chamber and a quadrangular or squared piezo element according to the known technology.

FIG. 5A shows a top view of a micro pump 500A in accordance with the known technology. The micro pump 500A comprises a quadrangular pump body 501A. A quadrangular diaphragm 502A is arranged on the pump body 501A. A quadrangular piezo element 503A is arranged on the diaphragm 502A. A quadrangular pump chamber 504A, illustrated in broken lines, is provided between the diaphragm 502A and the pump body 501A.

In order to mount or bond the diaphragm 502A to the pump body 501A, a circumferential chip edge 505A has to remain between the quadrangular pump chamber 504A and the outer sides of the quadrangular pump body 501A. In order to provide a sufficient area for bonding, the chip edge 505A has to comprise a width $B_V$ of at least 300 μm or more along the circumference.

Figure 5B:
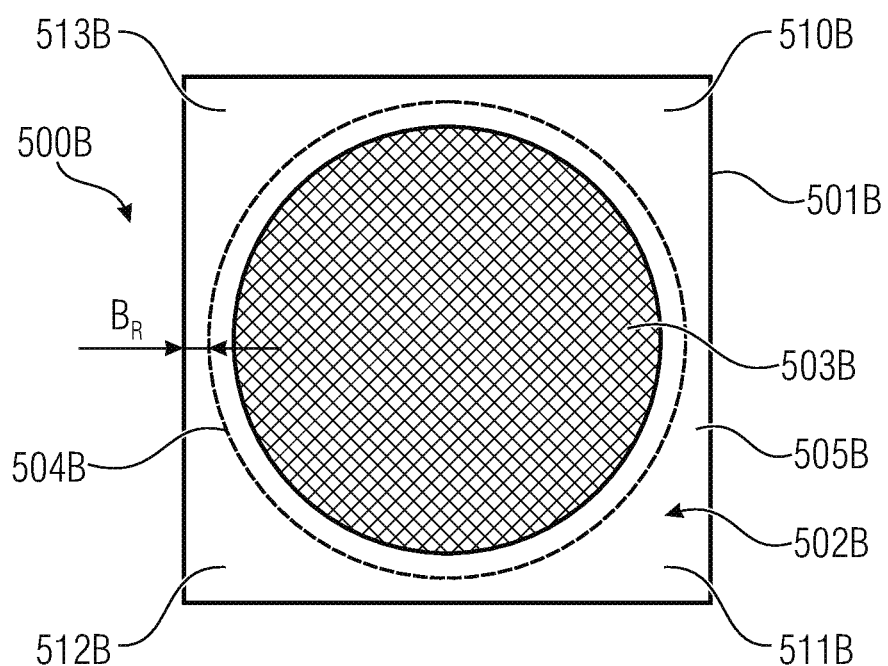
FIG. 5B is a top view of a model pump comprising a circular pump chamber and a circular piezo element.

FIG. 5B shows a top view of a model of a micro pump 500B. The micro pump 500B comprises a quadrangular pump body 501B. A quadrangular diaphragm 502B is arranged on the pump body 501B. A circular piezo element 503B is arranged on the diaphragm 502B. A circular pump chamber 504B, illustrated in broken lines, is provided between the diaphragm 502B and the pump body 501B.

Due to the circular pump chamber 504B, considerably more space for bonding the diaphragm 502B remains in the four corners 510B, 511B, 512B, 513B when compared to the known technology shown in FIG. 5A. Thus, the circumference of the circular pump chamber 504B may come closer to the edge of the quadrangular pump body 501B. The circumferential chip edge 505B may thus, when compared to the known technology shown in FIG. 5A, comprise a reduced minimum width $B_R$, wherein the width $B_R$ is measured in a region of the smallest edge distance, that is in a region where the outer circumference of the pump chamber 504B is spaced apart the least from an outer side of the quadrangular pump body 501A.

As has been mentioned in the beginning, there is at present no technology, suitable for mass production, for providing circular piezo elements, as shown in FIG. 5B. The pump 500B shown in FIG. 5B thus represents only an idealized model which has been modelled for comparative purposes for simulation trials mentioned below.

Figure 5C:
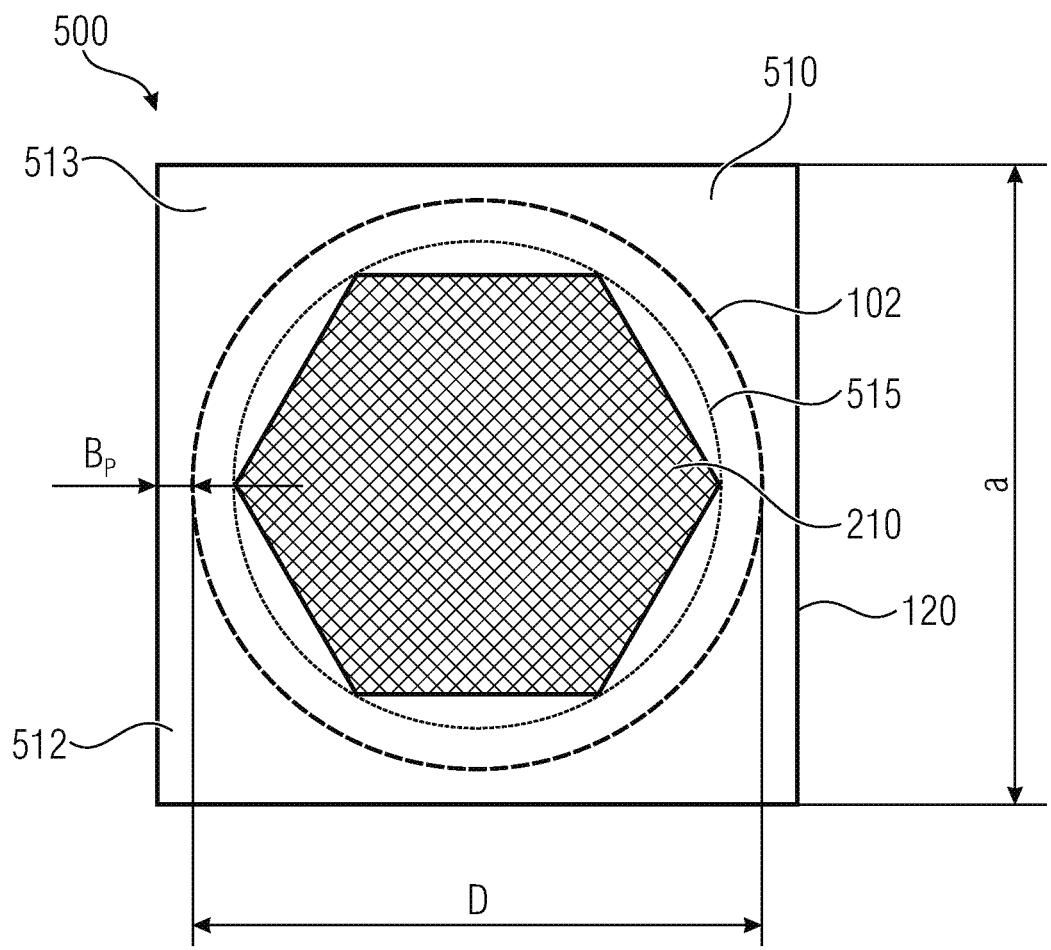
FIG. 5C is a top view of an inventive pump comprising a circular pump chamber and a hexagonal piezo element.

FIG. 5C shows an inventive pump 500 in top view. This embodiment basically corresponds to the pump 200 shown in FIG. 3. The pump 500 comprises a quadrangular pump body 120. The pump body 120 is squared and comprises a lateral length a of, for example, 5 mm.

A diaphragm 110 is arranged on the side of the pump body 120 facing the observer. A piezo element 210 is arranged on the side of the diaphragm 110 facing the observer. The piezo element 210 comprises a regular polygon shape having six corners. Due to the regular polygon shape, the polygon-shaped piezo element 210 may define a circumcircle 515 illustrated as a dotted line.

The pump 500 comprises a circular pump chamber 102 illustrated in a broken line. Since there is more space for mounting the pump diaphragm 110 in the four corners 510, 511, 512, 513 when compared to the known technology, the minimum edge distance $B_P$ between the pump chamber 102 and the outer sides of the pump body 120 may be reduced so that the diameter D of the pump chamber 102 may be increased.

For illustrating the advantages of the invention compared to the known technology, simulations using the simulation program ANSYS have been performed, the results of which will be discussed in greater detail referring to FIGS. 6A and 6B.

Simulations relating to the efficiency of an inventive pump comprising a polygon piezo element (FIG. 5C) when compared to pumps of equal dimensions, but having a quadrangular (FIG. 5A) and circular piezo element (FIG. 5B) were performed.

The outer square illustrated in FIGS. 5A, 5B and 5C describes the chip size of the micro pump 500, 500A, 500B, the outer broken-line circle, or broken-line square, describes the boundary of the pump chamber 102, 504A, 504B, whereas the shadowed interior areas represent the shape of the piezo elements 210, 503A, 503B. The "diameter", that is the circumcircle of the inventive hexagonal piezo element 201, corresponds to the circle radius in which the hexagon may be defined (dotted circle).

It may be seen that, with an equal minimum distance $B_V$, $B_R$, $B_P$ between the pump chamber and the edge of 300 µm, for example, the bond area is considerably larger in the circular pump chamber (FIGS. 5B, 5C) than in a squared pump chamber (FIG. 5A).

The simulations using the program ANSYS were performed using the following parameters:

| Chip size: | 5 × 5 mm² |
| Pump chamber diameter: | 4400 µm |
| Diaphragm thickness: | 30 µm |
| Piezoceramic thickness: | 55 µm |
| Material values: | |
| Silicon modulus of elasticity | 1.60E+11 Pa |
| Silicon Poisson ratio | 0.25 |
| Piezo modulus of elasticity | 8.00E+10 Pa |
| Piezo Poisson ratio | 0.25 |
| Piezo d31: | 3.50E−10 m/V |
| Voltage stroke: | +82.5 V/−22 V |

Figure 6A:
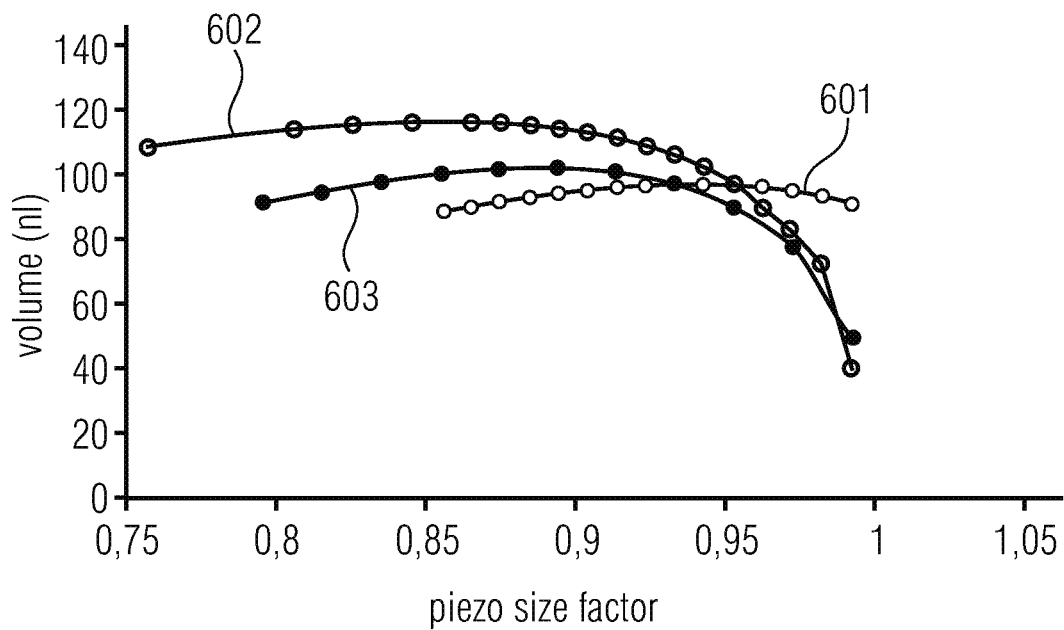
FIG. 6A shows an evaluation of a simulation of the pump shapes shown in FIGS. 5A, 5B and 5C of the stroke volume in dependence on the size of the piezo element.

FIG. 6A shows the simulation results for the stroke volume in nanoliters (y axis) depending on the piezo size (x axis). Graph 601 shows the simulation results of an inventive pump having a hexagonal piezo element above a circular pump chamber (FIG. 5C). Graph 602 shows the simulation results of a pump having a quadrangular piezo element above a quadrangular pump chamber (FIG. 5A) for comparison. Graph 603 shows the simulation results of a pump having a circular piezo element above a circular pump chamber (FIG. 5B) for comparison.

Figure 6B:
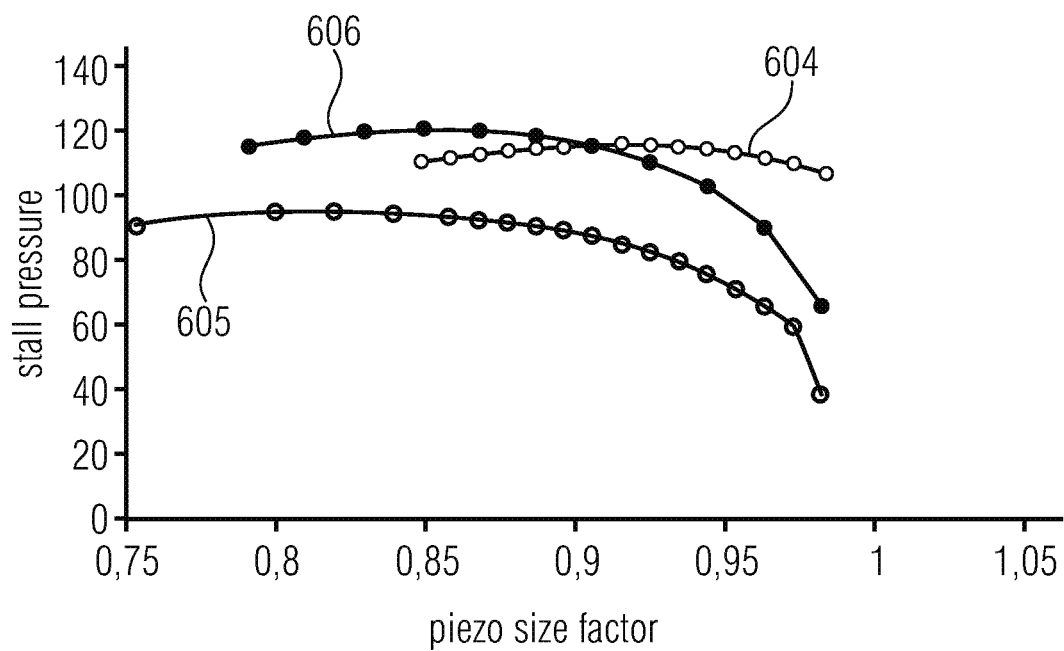
FIG. 6B shows an evaluation of a simulation of the pump shapes shown in FIGS. 5A, 5B and 5C of the stall pressure in dependence on the size of the piezo element.

FIG. 6B shows the simulation results for the stall pressure (y axis) in dependence on the piezo size (x axis). Graph 604 shows the simulation results of an inventive pump having a hexagonal piezo element above a circular pump chamber (FIG. 5C). Graph 605 shows the simulation results of a pump having a quadrangular piezo element above a quadrangular pump chamber (FIG. 5A) for comparison. Graph 606 shows the simulation results of a pump having a circular piezo element above a circular pump chamber (FIG. 5B) for comparison.

Thus, the piezo size factor is defined as follows: For a circle, the following applies:

$$\text{Piezo Size Factor} = \frac{\text{Diameter of the circular Piezo Element}}{\text{Diameter of the Pump Chamber}}$$

For a hexagon, the following applies:

$$\text{Piezo Size Factor} = \frac{\text{Max. diameter of the hexagonal Piezo Element}}{\text{Diameter of the Pump Chamber}}$$

For a square, the following applies:

$$\text{Piezo Size Factor} = \frac{\text{Lateral length of the quadrangular Piezo Element}}{\text{Lateral length of the Pump Chamber}}$$

The following table (Table 1) summarizes the optimum piezo geometries, that is, the piezo size factor where the stroke volume and the stall pressure are maximum. Since the maximums of stroke volume and stall pressure are not maximum at exactly the same piezo size factor, that piezo size factor will be selected where the product of stroke volume $V_{stroke}$ and stall pressure $p_{stall}$ is maximum. This product will subsequently also be defined as the "efficiency":

$$\text{Efficiency} = V_{stroke} \cdot p_{stall}$$

This product is a measure of the efficiency of the inventive piezo diaphragm transducer. The efficiency is best with circular diaphragms, followed by the hexagonal geometry and the squared diaphragm.

TABLE 1

| | Circular | Hexagonal | Square |
|---|---|---|---|
| Piezo Size Factor (optimum) | 0.87 | 0.93 | 0.84 |
| $V_{stroke}$ [nl] | 102.7 | 98.7 | 117.7 |
| $p_{stall}$ [kPa] | 120.7 | 116.3 | 94.4 |
| $V_{stroke} * p_{stall}$ | 12396 | 11479 | 11111 |
| Relative efficiency relative to a squared geometry | 111.6% | 103.3% | 100.0% |

It becomes clear from this consideration that the hexagon geometry is more efficient than the square geometry. The relative efficiency in the inventive hexagonal shape of the piezo element, relative to the square geometry, is higher or better by 3.3% than in a comparative piezo element of a square shape.

What has not been considered so far is the fact that the edge distance $B_R$, $B_V$, $B_P$ can be selected to be smaller with circular pump chambers, for example $b_2$=100 µm instead of $b_1$=300 µm. This is caused by the fact that, with a circular pump chamber (FIGS. 5B, 5C) when compared to a squared pump chamber (FIG. 5A) considerably more bond area is available in the four corners 510, 511, 512, 513.

With otherwise equal parameters, the stroke volume increases by the fourth power of the diaphragm lateral length, whereas (again, with equal parameters) the stall pressure decreases by the second power.

Consequently, the efficiency defined here increases by the second power of the diaphragm lateral length.

This means that the efficiency (with equal chip dimensions with a lateral length a, for example, a=5 mm) can be improved further with circular and hexagonal piezo elements:

$$\text{Improvement Factor} = \frac{\text{Efficiency at small edge distance}}{\text{Efficiency at great edge distance}} = \left(\frac{a - 2b_2}{a - 2b_1}\right)^2$$

With the parameters selected here, the improvement factor is 1.19, or 19%. With a chip size of 5 mm and an edge distance of $b_2$=100 μm instead of an edge distance of $b_1$=300 μm, the circular piezo element and the hexagonal piezo element would consequently be more efficient by 19% than the square piezo element, due to the fact alone that, with circular pump chambers, the minimum distance of the diaphragm may be placed much closer to the chip edge.

This means that, in addition to the improvement in efficiency of 3.3% from Table 1, an improvement of further 19% can be achieved since the chip edge (that is the minimum distance between pump chamber and pump body) can be reduced with circular pump chambers.

With a chip dimension of a=3 mm and equal edge dimensions $b_1$, $b_2$, the efficiency of a circular pump chamber, compared to a quadrangular pump chamber, will then improve by 36.1% and, with a lateral length of the pump chip of 2 mm, even by 65.3%, as can be seen in Table 2.

TABLE 2

| Efficiency Advantage | Circular | Hexagon | Square |
| --- | --- | --- | --- |
| piezo size factor (optimum) | 0.87 | 0.93 | 0.84 |
| $V_{stroke}$ [nl] | 102.7 | 98.7 | 117.7 |
| $P_{stall}$ [kPa] | 120.7 | 116.3 | 94.4 |
| $V_{stroke} * P_{stall}$ | 12396 | 11479 | 1111 |
| Relative Efficiency | 111.6% | 103.3% | 100.0% |
| Edge Advantage 5 mm | 119.0% | 119.0% | 100.0% |
| Total Advantage 5 mm | 132.8% | 122.9% | 100.0% |
| Edge Advantage 3 mm | 136.0% | 136.0% | 100.0% |
| Total Advantage 3 mm | 151.7% | 140.5% | 100.0% |
| Edge Advantage 2 mm | 165.3% | 165.3% | 100.0% |
| Total Advantage 2 mm | 219.5% | 203.2% | 100.0% |

It becomes obvious here that the advantage of a hexagon piezoceramic has its best effect particularly when miniaturizing the pump chip: like the square diaphragm, it may be sawn from the sawing film, but (compared to an ideal, circular piezoceramic) loses only a few percent in efficiency, whereas the hexagon piezoceramic is much more efficient with small chip dimensions, when compared to the square diaphragm, for example, with a pump chip with a dimension of 3 mm by 40%.

The stroke volume and the stall pressure may (with a certain diaphragm lateral length a) be adjusted by changing the thickness of the diaphragm and the piezoceramic, that is the thickness of the piezo diaphragm transducer. In order to obtain, for example, the same stall pressure n stall with larger diaphragm diameters, the diaphragm and the piezoceramic have to be made thicker.

A hexagon piezoceramic is of advantage for another reason:

When dicing the piezoceramic layer not using straight sawing cuts, but by a beam or jet cutting method, for example laser cutting, water jet cutting or electron beam cutting, etc., and achieving by this any shapes, for example also a circular shape, a hexagon shape may be sawn from the film with no scrap at all, similar to a honeycomb pattern. The hexagon shape, however, can then no longer be cut using straight cuts.

As the simulations discussed above have shown, the hexagon piezo element comprises nearly as large a stroke and stall pressure as does a circular model piezo element. When the area of the piezoceramic represents a cost factor, that is when scrap is to be reduced or avoided, and beam or jet cutting technologies are available, it is of advantage to dice hexagonal piezoceramics from the film in order to avoid scrap.

Octagonal structures can also be sawn from the film using straight cuts, however, the scrap in this case increases from 25% (with hexagons) to 50% (with octagons).

Even larger regular polygons, that is polygons having more than eight corners, and advantageously an even number of corners, can be sawn entailing even more scrap.

The higher the polygon number, the more precisely can a circular form be represented.

Although some aspects have been described in connection with a device, it is to be understood that these aspects also represent a description of the corresponding method so that a block or element of a device is to be understood to be also a corresponding method step or feature of a method step. In analogy, aspects having been described in connection with or as a method step, also represent a description of a corresponding block or detail or feature of a corresponding device. Some or all the method steps may be performed by a hardware apparatus (or using a hardware apparatus), like a microprocessor, a programmable computer or electronic circuit, for example. In some embodiments, some or several of the most important method steps may be performed by such an apparatus.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A method for producing a pump, wherein a piezo diaphragm transducer is mounted to a pump body, the method comprising:
   providing a pump comprising an annular pump chamber and a pump body,
   wherein the pump body comprises a dimension of 7×7 mm² or less,
   wherein an outer circumference of the pump chamber is spaced apart from an outer circumference of the pump body by a distance $B_P$, providing an edge where the piezo diaphragm transducer is mounted, wherein the distance $B_P$, at the smallest location, is less than 300 μm,
   providing a piezoceramic layer,
   dicing at least one piezo element from the piezoceramic layer so that the at least one piezo element comprises a regular polygon shape comprising at least six corners, and
   forming the piezo diaphragm transducer by mounting the piezo element to a pump diaphragm,
   wherein a piezo size factor is defined as $$PiezoSizeFactor = \frac{\text{Max. diameter of the at least one Piezo Element}}{\text{Diameter of the Pump Chamber}}$$

wherein the method further comprises
selecting one of a plurality of piezo size factors for the piezo diaphragm transducer, wherein a stroke volume and a stall pressure for the plurality of piezo size factors are determined for a pump with predetermined parameters and the one of the plurality of piezo size factors has a product of the stroke volume and the stall pressure that is maximal.

2. The method in accordance with claim 1, wherein the distance $B_P$ is less than 200 µm.

3. The method in accordance with claim 1, wherein the pump provided comprises a circular pump chamber.

4. The method in accordance with claim 1, wherein mounting the piezo element to the pump diaphragm for forming the piezo diaphragm transducer is performed after mounting the pump diaphragm to the pump body.

5. The method in accordance with claim 1, wherein mounting the piezo element to the pump diaphragm for forming the piezo diaphragm transducer is performed before mounting the pump diaphragm to the pump body.

6. The method in accordance with claim 1, wherein dicing the at least one piezo element from the piezoceramic layer is performed such that the at least one piezo element comprises an even number of polygon corners.

7. The method in accordance with claim 1, wherein dicing the at least one piezo element from the piezoceramic layer is performed such that the at least one piezo element comprises at least eight corners.

8. The method in accordance with claim 1, wherein, when dicing the piezo element, the piezo element is sawn from the piezoceramic layer in straight cuts along a defined sawing pattern.

9. The method in accordance with claim 1, wherein, when dicing the piezo element, the piezo element is cut from the piezoceramic layer along a defined cutting pattern by means of a beam or jet cutting method.

10. The method in accordance with claim 1, wherein the piezoceramic layer is a polarized piezoceramic film.

11. The method in accordance with claim 1, wherein the diaphragm is biased so that the diaphragm, in an unactuated state, is spaced apart from the pump body at least in portions and this spaced region forms the pump chamber of circular shape in top view.

* * * * *